United States Patent
Morand et al.

(10) Patent No.: US 6,521,533 B1
(45) Date of Patent: Feb. 18, 2003

(54) METHOD FOR PRODUCING A COPPER CONNECTION

(75) Inventors: Yves Morand, Grenoble (FR); Yveline Gobil, Grenoble (FR); Olivier Demolliens, St Egreve (FR); Myriam Assous, Grenoble (FR)

(73) Assignees: Commissariat a l'Energie Atomique, Paris (FR); STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/070,898

(22) PCT Filed: Sep. 12, 2000

(86) PCT No.: PCT/FR00/02515

§ 371 (c)(1),
(2), (4) Date: Mar. 13, 2002

(87) PCT Pub. No.: WO01/20665

PCT Pub. Date: Mar. 22, 2001

(30) Foreign Application Priority Data

Sep. 14, 1999 (FR) .............................................. 99 11468

(51) Int. Cl.[7] .......................................... H01L 21/768
(52) U.S. Cl. ...................... 438/687; 438/637; 438/639; 438/623
(58) Field of Search ................................ 438/687, 637, 438/618, 639, 623, 674, 675, 597, 622

(56) References Cited

U.S. PATENT DOCUMENTS

| 5,966,634 A | | 10/1999 | Inohara et al. | |
| 6,127,089 A | * | 10/2000 | Subramanian et al. ... | 430/270.1 |
| 6,287,977 B1 | | 9/2001 | Hashim et al. | |
| 6,291,334 B1 | * | 9/2001 | Somekh ...................... | 438/620 |
| 6,291,887 B1 | * | 9/2001 | Wang et al. ................ | 257/758 |
| 2001/0006848 A1 | * | 7/2001 | Allada et al. ............... | 438/687 |
| 2001/0016419 A1 | * | 8/2001 | Huang ......................... | 438/687 |

FOREIGN PATENT DOCUMENTS

| EP | 0 798 778 | 10/1997 |
| EP | 0 913 863 | 5/1999 |
| WO | WO 00/07236 | 2/2000 |

OTHER PUBLICATIONS

IBM Technical Disclosure Bulletin, vol. 32, No. 10b, XP–002035812, pps. 114–115, "Lithographic Patterns with a Barrier Liner", Mar. 1, 1990.

* cited by examiner

*Primary Examiner*—Richard Elms
*Assistant Examiner*—Beth E. Owens
(74) *Attorney, Agent, or Firm*—Oblon, Spivak, McClelland, Maier & Neustadt, P.C.

(57) ABSTRACT

The invention relates to a process for making a copper connection with a copper connection element in an integrated circuit comprising a damascene structure, with the connection element being covered successively with an encapsulation layer and at least one layer of dielectric material with a very low dielectric constant. The process includes the steps of etching the layer of dielectric material until the encapsulation layer is reached in order to obtain a connection hole opposite the connection element. A protective layer is then formed on the walls of the connection hole, with the protective layer preventing contamination of the dielectric layer from diffusion of copper. The protective and encapsulation layers are then etched at the bottom of the connection hole in such a way as to reveal the connection element. The connection hole is then filled with copper.

8 Claims, 2 Drawing Sheets

METHOD FOR PRODUCING A COPPER CONNECTION

TECHNICAL FIELD

The present invention concerns a process for making a copper connection through a layer of dielectric material in an integrated circuit.

STATE OF THE PRIOR ART

The improvements in the performance of integrated circuits (speed, low consumption) have required a change in some of the materials that have been used up till now. In order to reduce the capacity that exists between the conductive lines formed in one or several layers of dielectric material (damascene-type structures), it is advantageous to use, as the dielectric material, materials with a very low dielectric constant. These materials, called "low-k" materials, comprise organic materials and porous materials.

The improvements in the performance have also been achieved through the use of a metal that is more conductive than aluminium, which has traditionally been used to make the interconnection lines. Copper, whose resistivity is nearly half that of aluminium doped with copper, has shown itself to be the best candidate.

FIGS. 1 and 2 show the preparatory steps for making a cross over (or via hole) in the copper in the case of a single damascene structure, according to the prior art.

FIG. 1 shows a layer of dielectric material 1 covering a semiconductor substrate (not shown), with this layer comprising a connection element 2 made out of copper that is level with the surface of the dielectric material 1. An encapsulation layer 3 is deposited on the surface of the layer 1. A layer of dielectric material 4 is deposited on the encapsulation layer 3. A hard masking layer 5 is deposited on the layer 4 in order to define the location of the via hole 6, obtained by etching. The encapsulation layer 3 may be made out of SiN. It acts as a protective layer for the layer of dielectric material 4 by preventing the contamination of this dielectric material by the copper in the connection element 2. It also acts as a barrier layer for the etching of the layer 4.

As shown in FIG. 2, the encapsulation layer 3 is then etched in the bottom of the hole 6, for example by a photolithographic process, in order to reveal the copper connection element 2 that needs to be contacted.

The following steps comprise spraying a layer of copper onto the hard masking layer 5 while filling the hole 6 in order to make contact with the connection element 2. Chemical-mechanical polishing of the copper until the level of the hard mask is reached makes it possible to eliminate the excess copper and obtain the via hole in the copper.

After etching the encapsulation layer 3, two harmful effects can occur. The first harmful effect of this etching consists in spraying the copper onto the walls of the hole 6 from the revealed surface of the connection element 2. The second harmful effect consists in a pollution of the surface of the connection element 2 as a function of the type of chemistry used in the etching process.

In order to both eliminate the copper from the walls of the via holes and restore the condition of the surface of the copper at the bottom of the holes, those skilled in the prior art use dry and wet chemical methods. For example, when the layers of dielectric material are made out of SiO$_2$ or SiN, a cleaning sequence containing diluted HF and using a reactive plasma containing hydrogen is efficient.

When the dielectric material of the damascene structure is a "low-k" material, several problems arise. As the copper is sprayed after etching the encapsulation layer, it may cause in-depth contamination of the layer of "low-k" material (in the case of a polymer or a porous material). There is then a deterioration in the local dielectric properties (for example, the dielectric constant, the discharge field and the leakage current) of this material. The cleaning processes may not be able to be used because of the risk of attack, or even deterioration, of the dielectric material that these processes may cause. Moreover, these cleaning processes do not allow decontamination of the bulk of dielectric material. In the case of a "low-k" material such as SiLK, the use of hydrogen fluoride is advised against because it diffuses into this material and causes the hard mask to disbond. At this moment in time, there is no cleaning solution for SiLK. Those skilled in the art therefore do their best to avoid its contamination.

In addition, the use of "low-k" material generally causes problems in the mechanical resistance of the structures. When a polymer based dielectric material or a porous dielectric material is used, offsets can occur in the via holes due to the fact that the polymer is a relatively soft material or, in the case of a porous dielectric material, during the chemical-mechanical polishing of the copper.

DESCRIPTION OF THE INVENTION

The invention provides a solution to the problems described above.

The object of the invention is a process for making a copper connection with a copper connection element in an integrated circuit comprising a damascene structure, with the connection element being covered successively with an encapsulation layer and at least one layer of dielectric material with a very low dielectric constant (called a "low-k" material), the process comprising the following steps:

- etching said layer of dielectric material until the encapsulation layer is reached in order to obtain a connection hole, opposite the connection element,
- forming a protective layer on the walls of the connection hole, with the protective layer enabling contamination of the layer of dielectric material by diffusion of copper to be avoided,
- etching the encapsulation layer, at the bottom of the connection hole, in such a way as to reveal the connection element,
- filling the connection hole with copper.

The protective layer that remains on the walls of the hole prevents contamination of the dielectric material. It makes it possible for the connection hole to be cleaned without any risk. It reinforces the mechanical rigidity of the structure. It is also advantageous if spacers are used, providing they do not act as a barrier to the diffusion of the copper.

After the anisotropic etching of the encapsulation layer and before the step of filling the connection hole, the process may comprise a step of cleaning the walls and the bottom of the connection hole. If the protective layer is made out of a material that acts as a barrier to the diffusion of copper, this cleaning step of the walls of the hole can be omitted.

The encapsulation layer may be a layer of SiN.

The layer of dielectric material with very a low dielectric constant may be a material chosen among polymers and porous materials.

If the layer of dielectric material is covered with a hard masking layer, the process may comprise a preliminary step of forming, in the hard masking layer, an opening opposite the connection element, with the etching of the layer of dielectric material being achieved through the opening in the hard masking layer. The hard masking layer may be a layer of material chosen from silicon oxide, silicon carbide and silicon nitride.

The step of depositing a protective layer may consist in depositing a layer of metallic material, such as $SiO_2$, SiCH, TiN or SiN.

BRIEF DESCRIPTION OF THE DRAWINGS

The invention will be more fully understood and other advantages and specific features will become clearer on reading the description that follows, given by way of example and in no way limiting, and by referring to the annexed drawings, in which.

DETAILED DESCRIPTION OF THE EMBODIMENTS OF THE INVENTION

Figure 1:
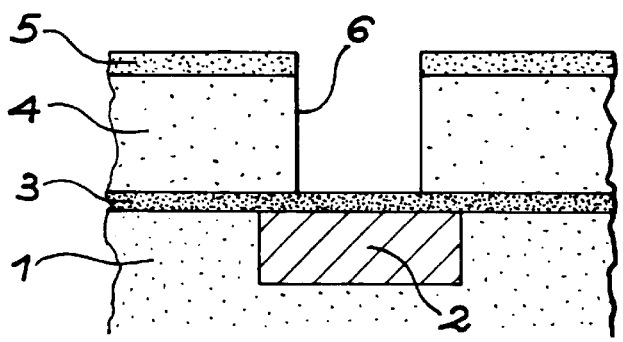
FIGS. 1 and 2, already described, illustrate the preparatory steps for making a copper via hole in the case of a single damascene structure according to the prior art.
Figure 2:
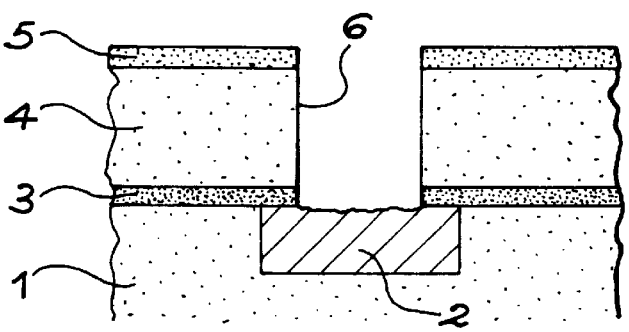
Figure 3:
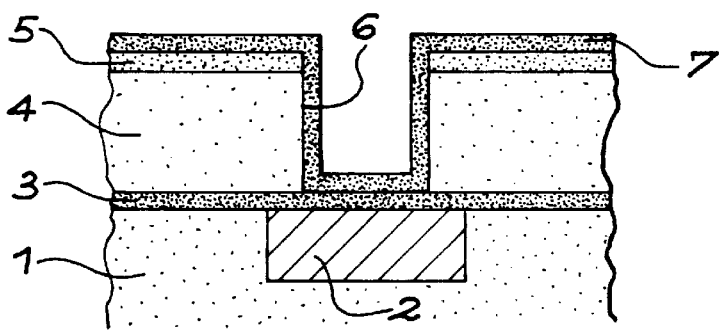
FIGS. 3 and 4 illustrate the preparatory steps for making a copper via hole in the case of a single damascene structure according to the invention.
Figure 4:
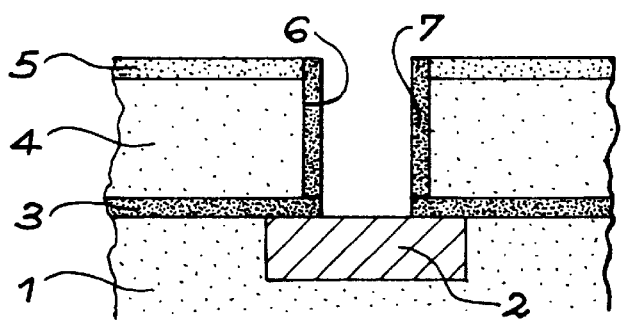

FIGS. 3 and 4 illustrate the preparatory steps for making a copper via hole in the case of a single damascene structure according to the invention. This structure is analogous to that described in FIG. 1, with the same references being used to designate the same elements. However, the layer of dielectric material 4 is a "low-k" material, for example a polymer with a very low dielectric constant, in other words having a relative permittivity of less than 4.2, or a porous material.

As shown in FIG. 3, once the hole 6 has been made to reveal the encapsulation layer 3, a thin protective layer 7 is deposited, which closely hugs the free surface in the damascene structure. The walls of the hole 6 and its bottom are thus covered with the protective layer. This protective layer is, for example, SiN.

The following step consists in carrying out an anisotropic etching of the protective layer 7. The etching is designed to attack the parts represented horizontally on FIG. 3 and to leave intact the parts represented vertically. As shown in FIG. 4, the only part of the protective layer 7 that remains is the part of this layer covering the walls of the hole 6. FIG. 4 also shows that the part of the encapsulation layer 3 located at the bottom of the hole 6 has been eliminated during the etching, thus revealing the copper connection element 2. If the hard masking and encapsulation layers are made out of different materials, it may be necessary to use two different etchings.

The part of the protective layer 7 covering the walls of the hole 6 efficiently protects the dielectric material of the layer 4 when the etching reveals the connection element 2 and during the cleaning of the hole 6.

Figure 5:
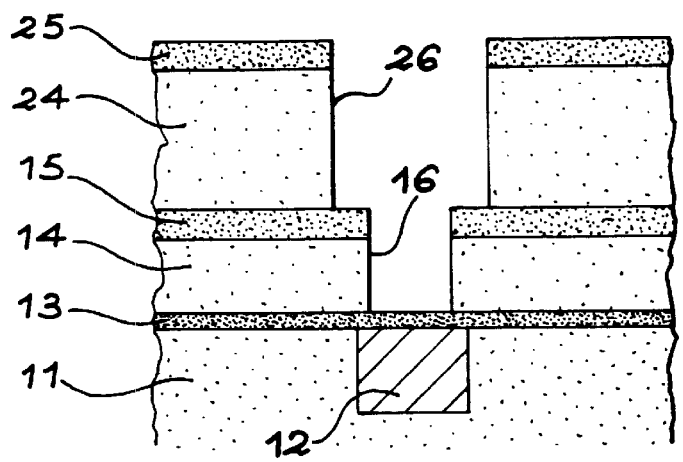
FIGS. 5 to 7 illustrate the preparatory steps for making a copper via hole in the case of a double damascene structure according to the invention.
Figure 6:
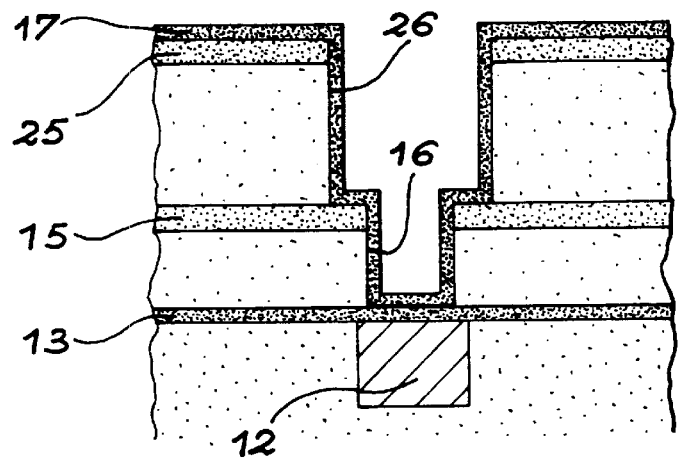
Figure 7:
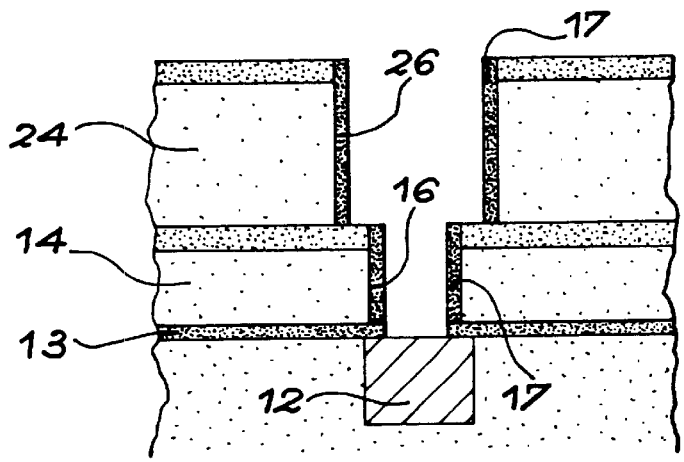

FIGS. 5 to 7 illustrate the preparatory steps for making a copper via hole in the case of a double damascene structure according to the invention.

FIG. 5 shows a layer of dielectric material 11 comprising a copper connection element 12 level with the surface of the layer 11. An encapsulation layer 13 is deposited onto the surface of the layer 11. A first layer of dielectric material 14 is deposited onto the encapsulation layer 13. A layer 15, which acts as a hard mask for the first layer of dielectric material 14, is then deposited. A second layer of dielectric material 24 is then deposited onto the hard masking layer 15, and then a layer 25 that acts as a hard mask for the second layer of dielectric material 24 is deposited.

The encapsulation layer 13 may be made out of SiN, the layers 14 and 24 may be made out of SiLK and the hard masking layers 15 and 25 may be made out of $SiO_2$ or silicon nitride.

Using traditional methods, the layers of dielectric material 14 and 24 are etched through openings made in their hard masks 15 and 25 in order to obtain the superimposed holes 16 and 26.

As shown in FIG. 6, once the holes 16 and 26 have been formed to reveal the encapsulation layer 13, a thin protective layer 17 is deposited, which hugs the free surface of the double damascene structure. The protective layer 17 may be made out of SiN or TiN.

The following step consists in carrying out an anisotropic etching of the protective layer 17. The etching is designed to attack the parts represented horizontally in FIG. 6 and to leave intact the parts represented vertically. As shown in FIG. 7, the only parts of the protective layer 17 that remain are those covering the walls of the holes 16 and 26. FIG. 7 also shows that the part of the encapsulation layer 13 located at the bottom of the hole 16 has been eliminated during the etching, thus revealing the copper connection element 12.

The parts of the protective layer 17 covering the walls of the holes 16 and 26 efficiently protect the dielectric material in layers 14 and 24 while etching reveals the connection element 12 and while holes 16 and 26 are cleaned.

Layer 15 is not obligatory. However, it makes it easier to properly control the depth of the line and the dimensions of the hole. If the layer 15 has copper barrier properties, the bottom of the hole 26 (with an annular shape) does not require further protection.

What is claimed is:

1. A process for making a copper connection with a copper connection element in an integrated circuit comprising a damascene structure, with the copper connection element being covered successively with an encapsulation layer and at least one layer of dielectric material with a very low dielectric constant (called a "low-k" material), the process comprising the following steps:

etching said layer of dielectric material with the very low dielectric constant until the encapsulation layer is reached in order to obtain a connection hole opposite the copper connection element;

forming a protective layer on walls of the connection hole, whereby the protective layer prevents contamination of the layer of dielectric material with the very low dielectric constant from diffusion of copper;

etching the protective and encapsulation layers at the bottom of the connection hole in such a way as to reveal the copper connection element; and filling the connection hole with copper.

2. The process according to claim 1, whereby, after the etching of the encapsulation layer and before the filling of the connection hole, the process comprises a step of cleaning the connection hole.

3. The process according to claim 1, whereby the encapsulation layer is a layer of SiN.

4. The process according to claim 1, whereby said layer of dielectric material with a very low dielectric constant is a material chosen among polymers and porous materials.

5. The process according to claim 1, whereby the layer of dielectric material is covered with a hard masking layer, and the process comprises a preliminary step of forming, in the hard masking layer, an opening opposite the connection element, with the etching of the layer of dielectric material being achieved through an opening in the hard masking layer.

6. The process according to claim 5, whereby the hard masking layer is a layer of material chosen from silicon oxide, silicon carbide and silicon nitride.

7. The process according to claim 1, whereby the step of forming a protective layer comprises depositing a layer of metallic material.

8. The process according to claim 1, whereby the step of forming a protective layer comprises depositing a layer of material chosen among $SiO_2$, SiCH, TiN and SiN.

* * * * *